(12) United States Patent
Siddle

(10) Patent No.: US 6,716,323 B1
(45) Date of Patent: Apr. 6, 2004

(54) COATING GLASS

(75) Inventor: John Robert Siddle, Merseyside (GB)

(73) Assignee: Pilkington plc, Merseyside (GB)

( * ) Notice: Subject to any disclaimer, the term of this patent is extended or adjusted under 35 U.S.C. 154(b) by 0 days.

(21) Appl. No.: 09/890,413

(22) PCT Filed: Feb. 10, 2000

(86) PCT No.: PCT/GB00/00402

§ 371 (c)(1),
(2), (4) Date: Jul. 30, 2001

(87) PCT Pub. No.: WO00/47530

PCT Pub. Date: Aug. 17, 2000

(30) Foreign Application Priority Data

Feb. 12, 1999 (GB) ............................................. 99/03056

(51) Int. Cl.$^7$ .......................... C23C 14/34; B05D 5/06; B05D 3/00; B05D 1/36
(52) U.S. Cl. ................. 204/192.12; 427/162; 427/576; 427/250; 427/294; 427/404; 427/445
(58) Field of Search ....................... 204/192.12, 192.15, 204/192.27; 427/162, 576, 250, 294, 404, 445

(56) References Cited

U.S. PATENT DOCUMENTS

| | | | | |
|---|---|---|---|---|
| 5,837,361 A | * | 11/1998 | Glaser et al. ................ | 428/216 |
| 6,010,614 A | * | 1/2000 | Keskar et al. ............... | 205/765 |
| 6,398,925 B1 | * | 6/2002 | Arbab et al. ........... | 204/192.22 |
| 6,540,884 B1 | * | 4/2003 | Siddle et al. .......... | 204/192.22 |

* cited by examiner

Primary Examiner—Steven Versteeg
(74) Attorney, Agent, or Firm—Marshall & Melhorn, LLC

(57) ABSTRACT

A process for the production of a coated substrate, preferably glass, comprising depositing a reflective metal, especially a silver, layer by a low pressure deposition process performed in a coating atmosphere that contains a gasous oxygen scavenger. The presence of the gasous oxygen scavenger alleviates oxidation of the silver layer by any oxygen gas present in the coating atmosphere. The gaseous oxygen scavenger may be a hydrocarbon and is preferably methane. The coating process is preferably sputtering.

18 Claims, No Drawings

COATING GLASS

This invention relates to a process for the production of a coated substrate and, in particular, it relates to a process for the production of a coated substrate comprising depositing a reflective metal layer on to a substrate by a low pressure deposition process.

Substrates coated with a reflective metal layer, typically silver 5 nm to 30 nm thick, may be produced with low emissivity and a high visible light transmission i.e. reflecting a high proportion of infra-red radiation incident upon them but allowing visible radiation to pass through. For optimum light transmission the silver layers are sandwiched between anti-reflection layers usually of metal oxide. The use of such coatings on window glass leads to a reduction in heat loss. Substrates having such coatings are described, for example, in UK patent specification GB 2 129 831.

Coatings having multiple (usually two) silver layers, each silver layer being sandwiched between anti-reflection layers, may also be produced. Coatings with multiple silver layers have both low emissivity, and with appropriate layer thicknesses, a low transmission of solar heat.

Coatings with silver layers are produced by deposition processes in a coating atmosphere at low pressure, especially by sequential deposition of a metal oxide anti-reflection layer, a silver layer, and a metal oxide anti-reflection layer. The metal oxide layers are usually deposited by reactive sputtering in a coating atmosphere containing oxygen and an inert gas (usually argon). Silver and other reflective metal layers are deposited by sputtering in an inert gas (usually argon). In U.S. Pat. No. 5,837,361 a process for the production of a coating having layers of bismuth oxide ($Bi_2O_3$), zinc oxide, silver, nichrome, tin oxide and bismuth oxide is described, the metal oxide layers being reactively sputtered in an argon atmosphere containing oxygen and the silver layer being sputtered in an argon atmosphere with the addition of 5% by volume hydrogen.

In commercial production of sputtered coatings, sputtering of each layer usually proceeds in a sputtering chamber that has been initially evacuated to high vacuum (usually of about $10^{-6}$ mbar) and then raised to an operating pressure of around $10^{-3}$ mbar by flowing the gases making up the coating atmosphere into the chamber. The operating pressure is low so that the path length of the coating species sputtered from the target is high enough to reduce scattering and thereby maintain the efficiency of the coating process. Deposition of coatings may be performed in a single chamber having a readily changeable atmosphere or multiple, serially connected deposition chambers each containing the desired atmosphere. In the multiple chamber case, the substrate is moved sequentially between the chambers, which are separated by gas-tight slit valves to alleviate leakage of the coating atmosphere between chambers. It is particularly important to alleviate leakage of oxygen from the metal oxide deposition chambers to the silver deposition chambers because the reflective metal layer oxidises or degrades if deposited in a coating atmosphere containing oxygen, To reduce leakage further there are usually additional chambers, positioned between the deposition chambers, which are pumped at high rates so that oxygen in the coating atmospheres used for sputtering metal oxide layers is removed before it can leak into the silver deposition chamber.

The need for high pumping rates in the deposition chambers and in the additional chambers requires expensively high pumping capacity, slows production rates considerably and leakage can still occur. Particular problems arise where the substrate to be coated is curved. In order to accommodate the greater cross-section of curved substrates, high clearance slit valves are required with an increased likelihood of leakage and in consequence a need for even higher pumping rates.

We have discovered that a low pressure deposition process for depositing a reflective metal layer can tolerate the presence of oxygen if a gaseous oxygen scavenger is present in the coating atmosphere.

The present invention accordingly provides a process for the production of a coated substrate comprising depositing a reflective metal layer on to a substrate by a low pressure deposition process performed in a coating atmosphere, characterised in that the coating atmosphere contains a gaseous oxygen scavenger, wherein when the reflective metal layer is deposited as a layer in a multilayer coating which also contains a bismuth oxide layer said gaseous oxygen scavenger is not hydrogen.

In a preferred aspect, the present invention provides a process for the production of a coated substrate, characterised in that the coating atmosphere contains a gaseous oxygen scavenger other than hydrogen.

Oxygen can be present at a level that is too low to conveniently measure but nevertheless is high enough to oxidise or degrade the reflective metal layer. Thus, the coating atmosphere may contain the oxygen scavenger as a preventative measure, even if the deposition process is performed in a coating atmosphere that contains no measurable amount of oxygen.

Usually, the deposition process is performed in a coating atmosphere that contains oxygen (i.e. that contains a measurable amount of oxygen). The presence of oxygen in the coating atmosphere may arise by leakage from a deposition chamber containing a second coating atmosphere that contains oxygen or from outside (e.g. from the air).

The gaseous oxygen scavenger may be any substance capable of combining chemically with oxygen under the conditions of the low pressure deposition process. Such combination may take place in the gas phase or on the surface of the substrate.

Preferably each molecule of the gaseous oxygen scavenger is capable of combining with more than one atom or more preferably with more than one molecule of oxygen. This is advantageous because then only a small amount of oxygen scavenger need be added to the first coating atmosphere. Adding a large amount of oxygen scavenger to the atmosphere may increase the pressure and therefore reduce the efficiency of deposition. Preferably the gaseous oxygen scavenger has a relatively high vapour pressure at room temperature.

It is advantageous if the gaseous oxygen scavenger is such that the products of its interaction with the surface of the reflective metal layer or of its combination with oxygen are themselves gaseous because the likelihood of solids contamination of the reflective metal layer is thereby reduced. A preferred oxygen scavenger is a hydrocarbon (for example an alkane, alkene, or alkyne), more preferably a $C_1$ to $C_4$ hydrocarbon (for example ethane, ethylene, acetylene, propane or butane) and most preferably methane. Oxygen scavengers that are less preferred but may also be suitable include hydrogen carbon monoxide, nitric oxide and organic compounds, for example, methanol, ethanol or formaldehyde.

Preferably, the reflective metal layer is deposited in a coating atmosphere comprising a flowing gaseous mixture and wherein the gaseous oxygen scavenger is introduced into the coating atmosphere by incorporation in the flowing gaseous mixture.

The gaseous oxygen scavenger may also or alternatively be introduced into the coating atmosphere by incorporating it into a second coating atmosphere of e.g. a second deposition chamber so that at least some of it can leak from that second coating atmosphere into the first.

The amount of oxygen scavenger in the coating atmosphere should not be so great as to unacceptably increase the pressure, but should be sufficient to alleviate oxidation or degradation of the reflective metal layer. In practice, if the quality of the reflective metal coating deteriorates during deposition (the deterioration is determined, for example, by an increase in sheet resistance), the amount of oxygen scavenger in the coating atmosphere would be increased to reverse, alleviate or prevent the deterioration.

Thus, preferably, the coating atmosphere contains the gaseous oxygen scavenger in an amount that is sufficient to alleviate oxidation and/or degradation of the reflective metal layer.

Usually the coating atmosphere contains a measurable amount of oxygen and contains the gaseous oxygen scavenger in an amount that exceeds 15 mol % of the amount of oxygen, preferably that exceeds 30 mol % of the amount of oxygen, and more preferably that exceeds 50 mol %, of the amount of oxygen.

Preferably, the reflective metal layer is a silver layer, and preferably the reflective metal layer has a thickness in the range 5 to 30 nm, more preferably in the range 7 to 18 nm. At thicknesses lower than about 5 nm the reflective metal layer may be discontinuous (this results from the growth mechanism of a layer and may occur even on a flat substrate) and will then not possess the properties of the bulk metal resulting in poor infra red reflecting properties. Thicknesses higher than about 30 nm may cause the coated glass to have too high a visible light reflectivity.

It is known to estimate the infra red reflection of reflective metal layers by measuring the sheet resistance of the coating. A high sheet resistance indicates poor infra red reflecting properties (i.e. high emissivity), whereas a low sheet resistance indicates good infra red reflecting properties (i.e. low emissivity). Oxidation or oxygen induced degradation of a reflective metal layer increases the sheet resistance with consequently poorer infra red reflecting properties. The sheet resistance of a layer is defined as:

$R_s = \rho/d$ where $\rho$ is the resistivity of the layer, and d is its physical thickness (see, for example, *Thin Film Technology*, R. W. Berry, P. M. Hall and M. T. Harris (D. Van Nostrand, 1968) pp 329–331). The units of sheet resistance are $\Omega$/square.

In the present invention, preferably the sheet resistance of the reflective metal layer is below 12 $\Omega$/square. It is advantageous if, in the process, the coating atmosphere contains a measurable amount of oxygen and the sheet resistance of the reflective metal layer deposited in a first coating atmosphere containing oxygen is below 12 $\Omega$/square, preferably below about 8 $\Omega$/square.

In a preferred embodiment, the process additionally comprises depositing a metal oxide anti-reflection layer by a low pressure deposition process before depositing the reflective metal layer. The metal oxide layer will usually be deposited from a coating atmosphere that contains oxygen. Usually, at least two metal oxide anti-reflection layers will be deposited so that the reflective metal layer is sandwiched between metal oxide anti-reflection layers. When two or more reflective metal layers are deposited (e.g. to provide a coating with low solar heat transmission) each reflective metal layer will usually be sandwiched between metal oxide anti-reflection layers. Examples of metal oxides suitable for use as anti-reflection layers include: zinc oxide, tin oxide, silicon oxide, zirconium oxide, titanium oxide, niobium oxide, molybdenum oxide, tungsten oxide, silicon nitride, silicon oxynitride and silicon oxycarbide. Additional layers of metal oxide, metals (e.g. nichrome, inconel or titanium) or other materials may also be present in the multi-layer coating by, for example, being deposited between the metal oxide anti-reflection layers and the reflective metal layers and/or between the substrate and a metal oxide layer.

Low pressure deposition processes are performed in flowing gas at pressures of below about $10^{-1}$ mbar, or preferably lower and include such processes as sputtering, reactive sputtering, evaporation and other forms of physical vapour deposition. The preferred low pressure deposition process for depositing the reflective metal layer is sputtering.

In prior art processes, deposition of each layer usually proceeds in a sputtering chamber, which has been initially evacuated to about $10^{-6}$ mbar to ensure removal of air, especially oxygen. The pressure of the chamber is then raised to an operating pressure of approximately $10^{-3}$ mbar by injection of the gases making up the coating atmosphere (usually argon for sputtering of the reflective metal and a mixture of argon and oxygen for sputtering of metal oxides).

The present invention is of particular benefit because with a gaseous oxygen scavenger present in the coating atmosphere, the deposition process is better able to tolerate incomplete removal of air.

Thus, in one embodiment, the present invention additionally provides a low pressure process for the deposition of a reflective metal layer on a substrate, performed in a deposition chamber containing a coating atmosphere, comprising evacuating the deposition chamber to a low first pressure, introducing a coating gas into the deposition chamber thereby raising the pressure therein to a higher second pressure of about $10^{-3}$ mbar, and sputtering the reflective metal layer at the second pressure, characterised in that the first pressure is about $10^{-4}$ mbar and in that the coating atmosphere contains a gaseous oxygen scavenger.

This is advantageous because evacuating to a higher pressure is more easily, rapidly and cheaply achieved (particularly because a lower pumping capacity is required).

The substrate to be coated is preferably glass but may be, for example, a transparent plastics substrate. The substrate may be flat or curved.

Coated glass produced by a process according to the invention has uses in many areas of glass use including in multiple glazing units and in laminated glass. Thus, in a further aspect the present invention provides coated glass comprising a glass substrate and a multilayer coating deposited on a surface of the glass substrate, wherein said multilayer coating comprises, in sequence, a first metal oxide anti-reflection layer, a reflective metal layer and a second metal oxide anti-reflection layer, characterised in that the reflective metal layer is deposited by a low pressure deposition process performed in a coating atmosphere containing a gaseous oxygen scavenger other than hydrogen.

In a further embodiment, the present invention provides use of a gaseous oxygen scavenger to reduce oxidation or oxygen induced degradation of a reflective metal layer in a process for the production of a coated substrate, said process comprising depositing the reflective metal layer on to a substrate by a low pressure deposition process performed in a coating atmosphere containing the oxygen scavenger.

The invention is illustrated by the following Examples in which silver reflective metal layers were deposited on glass substrates by sputtering in a coating atmosphere containing argon, oxygen to simulate oxygen leakage and methane as gaseous oxygen scavenger.

EXAMPLES 1–5

Layers of silver were deposited on soda-lime glass substrates (of dimension 20×20 cm, 20×10 cm or 20×40 cm) at room temperature and at a pressure of 2×10$^{-3}$ mbar by DC magnetron sputtering using a silver target of 99.9% purity and a power density (over approximately 160 cm$^2$) of about 3.1 W/cm$^2$. The coating atmosphere consisted of argon, oxygen and methane. All gases were obtained from B.O.C. Ltd and were Zero grade.

The glass substrates were positioned vertically in a holder and advanced at a glass traversal speed of 10–35 cm/min through the sputtering zone with a coating aperture of dimension approximately 1 cm.

After coating, the thickness of the silver layer was measured by computer fitting the optical transmission and reflection spectra of the coated glass, the spectra having been determined using a Hitachi U400 spectrophotometer.

The sheet resistance (in ohm/square) of the silver coatings was determined by a non-contact conductance monitor (Delcon Instruments 717 Conductance monitor).

Table 1 describes, for Examples 1–5, the flow rates of the gases in the coating atmosphere (in standard cm$^3$ per minute), the glass traversal speed, the thickness of the silver layer as determined and the sheet resistance of the coated glass.

COMPARATIVE EXAMPLES A AND B

Comparative Example A was conducted under the same conditions as Example 1 except that no oxygen and no methane were present in the coating atmosphere.

Comparative Example B was also conducted under the same conditions as Example 1 except that no methane was present in the coating atmosphere.

Table 2 describes, for Comparative Examples A and B, the flow rates of the gases in the coating atmosphere, (in standard cm$^3$/min), the glass traversal speed, the thickness of the silver layer and the sheet resistance of the coated glass.

TABLE 1

| Example | Flow rates of gases (standard cm$^3$/min) | | | Glass traversal speed (cm/min) | Thickness of silver layer (nm) | Sheet resistance (Ω/square) |
|---|---|---|---|---|---|---|
| | Ar | O$_2$ | CH$_4$ | | | |
| 1 | 22 | 4 | 6 | 35 | 7.3 | 8.1 |
| 2 | 22 | 4 | 6 | 25 | 11.6 | 5.3 |
| 3 | 22 | 4 | 0.6 | 35 | 9.2 | 12.0 |
| 4 | 22 | 40 | 20 | 20 | 8.7 | 11.9 |
| 5 | 22 | 40 | 30 | 10 | 15 | 3.8 |

TABLE 2

| Comparative Example | Flow rates of gases (standard cm$^3$/min) | | | Glass traversal speed (cm/min) | Thickness of silver layer (nm) | Sheet resistance (Ω/square) |
|---|---|---|---|---|---|---|
| | Ar | O$_2$ | CH$_4$ | | | |
| A | 22 | — | — | 35 | 9.2 | 5.0 |
| B | 22 | 4 | — | 35 | 9.2 | 12.5 |

What is claimed is:

1. A process for the production of a coated substrate comprising depositing a reflective metal layer onto a substrate by a low pressure deposition process performed in a coating atmosphere, wherein the coating atmosphere contains a gaseous oxygen scavenger other than hydrogen.

2. A process as claimed in claim 1 wherein the substrate is curved.

3. A process as claimed in claim 1 wherein each molecule of the gaseous oxygen scavenger is capable of combining with more than one atom of oxygen.

4. A process as claimed in claim 1 wherein the gaseous oxygen scavenger is a hydrocarbon.

5. A process as claimed in claim 4 wherein the gaseous oxygen scavenger is a C$_1$ to C$_4$ hydrocarbon.

6. A process as claimed in claim 5 wherein the gaseous oxygen scavenger is methane.

7. A process as claimed in claim 1 wherein the coating atmosphere contains the gaseous oxygen scavenger in an amount that is sufficient to alleviate oxidation and/or degradation of the reflective metal layer.

8. A process as claimed in claim 1 wherein the coating atmosphere contains a measurable amount of oxygen and contains the gaseous oxygen scavenger in an amount that exceeds 15 mol % of the amount of oxygen.

9. A process as claimed in claim 8 wherein the coating atmosphere contains the gaseous oxygen scavenger in an amount that exceeds 30 mol % of the amount of oxygen.

10. A process as claimed in claim 9 wherein the coating atmosphere contains the gaseous oxygen scavenger in an amount that exceeds 50 mol % of the amount of oxygen.

11. A process as claimed in claim 1 wherein the reflective metal layer is a silver layer.

12. A process as claimed in claim 1 wherein the reflective metal layer has a thickness in the range 5 to 30 nm.

13. A process as claimed in claim 12 wherein the reflective metal layer has a thickness in the range of 7 to 18 nm.

14. A process as claimed in claim 1 wherein the reflective metal layer has a sheet resistance which is below 12 Ω/square.

15. A process as claimed in claim 1 wherein the coating atmosphere contains a measurable amount of oxygen and the reflective metal layer deposited in the coating atmosphere has a sheet resistance which is below 12 Ω/square.

16. A process as claimed in claim 15 wherein the sheet resistance of the reflective metal layer deposited in the coating atmosphere is below 8 Ω/square.

17. A process as claimed in claim 1 wherein the low pressure deposition process for depositing the reflective metal layer is sputtering.

18. A process for the production of a coated substrate as claimed in claim 1 that additionally comprises depositing a metal oxide anti-reflection layer by a low pressure deposition process before depositing the reflective metal layer.

* * * * *